United States Patent
Meng et al.

(10) Patent No.: US 9,768,793 B2
(45) Date of Patent: Sep. 19, 2017

(54) ADAPTIVE DIGITAL QUANTIZATION NOISE CANCELLATION FILTERS FOR MASH ADCS

(71) Applicant: ANALOG DEVICES GLOBAL, Hamilton (BM)

(72) Inventors: Qingdong Meng, Belmont, MA (US); Hajime Shibata, Toronto (CA); Richard E. Schreier, New Castle (CA); Martin Steven McCormick, Cambridge, MA (US); Yunzhi Dong, Weehawken, NJ (US); Jose Barreiro Silva, Bedford, MA (US); Jialin Zhao, Santa Clara, CA (US); Donald W. Paterson, Winchester, MA (US); Wenhua W. Yang, Lexington, MA (US)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/365,867

(22) Filed: Nov. 30, 2016

(65) Prior Publication Data
US 2017/0179969 A1     Jun. 22, 2017

Related U.S. Application Data

(60) Provisional application No. 62/269,085, filed on Dec. 17, 2015.

(51) Int. Cl.
  H03M 3/00     (2006.01)
  H03M 1/08     (2006.01)
  H03M 1/12     (2006.01)

(52) U.S. Cl.
  CPC ............. *H03M 1/08* (2013.01); *H03M 1/124* (2013.01)

(58) Field of Classification Search
  CPC ...... H03M 1/08; H03M 1/124; H03M 1/0641; H03M 3/30; H03M 3/02; H03M 1/12;
  (Continued)

(56) References Cited

U.S. PATENT DOCUMENTS

| 4,862,169 A | 8/1989 | van Bavel |
| 5,959,562 A | 9/1999 | Wiesbauer |

(Continued)

FOREIGN PATENT DOCUMENTS

| CN | 101330482 | 7/2012 |
| EP | 2930850 | 3/2015 |

OTHER PUBLICATIONS

Non-Final Office Action (OA1) issued in U.S. Appl. No. 15/360,984 mailed Mar. 27, 2017, 9 pages.
(Continued)

*Primary Examiner* — Khai M Nguyen
(74) *Attorney, Agent, or Firm* — Patent Capital Group

(57) ABSTRACT

For continuous-time multi-stage noise shaping analog-to-digital converters (CT MASH ADCs), quantization noise cancellation often requires accurate estimation of transfer functions, e.g., a noise transfer function of the front end modulator and a signal transfer function of the back end modulator. To provide quantization noise cancellation, digital quantization noise cancellation filters adaptively tracks transfer function variations due to integrator gain errors, flash-to-DAC timing errors, as well as the inter-stage gain and timing errors. Tracking the transfer functions is performed through the direct cross-correlation between the injected maximum length linear feedback shift registers (LFSR) sequence and modulator outputs and then corrects these non-ideal effects by accurately modeling the transfer functions with programmable finite impulse response (PFIR) filters.

20 Claims, 11 Drawing Sheets

(58) Field of Classification Search
CPC ........ H03M 1/201; H03M 3/328; H03M 3/33; H03M 3/332
USPC .................................. 341/118, 131, 143, 155
See application file for complete search history.

(56) References Cited

U.S. PATENT DOCUMENTS

| | | | |
|---|---|---|---|
| 6,275,177 B1 | 8/2001 | Ho | |
| 6,473,019 B1* | 10/2002 | Ruha | H03M 3/334 341/143 |
| 6,518,904 B1* | 2/2003 | Jelonnek | H03M 7/3022 341/143 |
| 6,873,281 B1 | 3/2005 | Esterberg et al. | |
| 6,965,275 B2 | 11/2005 | De Giandomenico et al. | |
| 6,970,120 B1 | 11/2005 | Bjornsen | |
| 6,980,145 B1 | 12/2005 | Tammineedi | |
| 7,042,375 B1 | 5/2006 | van Engelen | |
| 7,321,325 B2 | 1/2008 | Hsieh et al. | |
| 7,385,537 B2 | 6/2008 | Yang et al. | |
| 7,548,071 B2 | 6/2009 | Harrison et al. | |
| 7,626,525 B2 | 12/2009 | Zhou | |
| 2006/0195776 A1 | 8/2006 | Yang et al. | |
| 2007/0090980 A1 | 4/2007 | Lin | |
| 2011/0163900 A1 | 7/2011 | Pagnanelli | |
| 2013/0194114 A1 | 8/2013 | Ritter et al. | |
| 2015/0288379 A1 | 10/2015 | Silva et al. | |

OTHER PUBLICATIONS

Notice of Allowance (1st Action) issued in U.S. Appl. No. 15/359,240 mailed Feb. 2, 2017, 9 pages.
Muhammed Bolatkale et al., *A 4GHz CT ΔΣADC with 70dB Dr and -74dBFS THD in 125MHz BW*, ISSCC 2011 / Session 27 / Oversampling Converters / 27.1, 2011 IEEE International Solid-State Circuits Conference, 978-1-61284-302-5/11 © 2011 IEEE, 3 pages.
Hajime Shibata et al., *A DC-to-1 GHz Tunable RF ΔΣ ADC Achieving DR= 74 dB and BW= 150 MHz at f0 = 450 MHz Using 550 mW*, © 2012 IEEE, 10 pages.
Yunzhi Dong et al., *A 235mW CT 0-3 MASH ADC Achieving -167dBFS/Hz NSD with 53MHz BW*, ISSCC 2014 / Session 29 / Data Converters for Wireless Systems / 29.2, © 2014 IEEE International Solid-State Circuits Conference, 3 pages.
Do-Yeon Yoon et al., *An 85dB-DR 74.6dB-SNDR 50MHz-BW CT MASH ΔΣModulator in 28nm CMOS*, ISSCC 2015 / Session 15 / Data-Converter Techniques / 15.1, 2015 IEEE International Solid State Circuits Conference © 2015 IEEE, 3 pages.
Péter Kiss et al., *Adaptive Digital Correction of Analog Errors in MASH ADCs—Part II. Correction Using Test-Signal Injection*, IEEE Transactions on Circuits and Systems—II: Analog and Digital Signal Processing, vol. 47, No. 7, Jul. 2000, 9 pages.
Yunzhi Dong et al., *A Continuous-Time 0-3 MASH ADC Achieving 88 dB DR with 53 MHz BW in 28 nm CMOS*, IEEE Journal of Solid-State Circuits, vol. 29, No. 12, Dec. 2014, 10 pages.
Yun-Shiang Shu et al., *LMS-Based Noise Leakage Calibration of Cascaded Continuous-Time ΔΣ Modulators*, IEEE Journal of Solid-State Circuits, vol. 45, No. 2, Feb. 2010, 12 pages.
Romuald Mazurek et al., *Application of Maximum-Length Sequences to Impulse Response Measurement of Hydroacoustic Communications Systems*, Gdańsk University of Technology, Gdańsk, Poland, 8 pages.
Gert Cauwengerghs et al., *Adaptive Digital Correction of Analog Errors in MASH ADC's—Part I: Off-Line and Blind On-Line Calibration*, IEEE Transactions on Circuits and Systems—II: Analog and Digital Signal Processing, vol. 47, No. 7, Jul. 2000, 8 pages.
J. Silva et al., *Digital Techniques for Improved ΔΣ Data Conversion*, IEEE Custom Integrated Circuits Conference © 2000, 8 pages.
Péter Kiss, *Adaptive Digital Compensation of Analog Circuit Imperfections for Cascaded Delta-Sigma Analog-to-Digital Converters*, Center for Design of Analog-Digital Integrated Circuits, Aug. 20, 1999, Oregon State University, 123 pages.
Victor Rodolfo Gonzalez-Diaz et al., *Efficient Dithering in MASH Sigma-Delta Modulators for Fractional Frequency Synthesizers*, article found in Circuits and Systems I: Regular Papers, IEEE Transactions on Oct. 2010, 11 pages.
Do-Yeon Yoon et al., *A Continous-Time Sturdy MASH ΔΣ Modulator in 28 nm CMOS*, IEEE Journal of Solid-State Circuits, vol. 50, No. 12, Dec. 2015, 11 pages.
Do-Yeon Yoon, *A Continous-Time Multi-Stage Noise Shaping Delta-Sigma Modulator for Next Generation Wireless Applications*, Jun. 2015 © Massachusetts Institute of Technology, 121 pages.
2nd Notice of Allowance issued in U.S. Appl. No. 15/359,240 dated Apr. 4, 2017, 10 pages.
EP Search Report issued in EP Patent Application Serial No. 16201799.0 dated Apr. 11, 2017, 12 pages.
European Search Report issued in EP Patent Application Serial No. 16202962.3 dated May 12, 2017, 12 pages.
Extended EP Search Report issued in EP Patent Application Serial No. 16201799.0 dated May 12, 2017, 10 pages.
Sudharsan Kanagaraj et al., *An Online Fully-digital Calibration of Leakage Noise in MASH Continuous Time ΔΣ modulators*, © 2011 IEEE, 978-1-4244-9474-3/11, 4 pages.
Bahar Jalali-Farahani et al., *Adaptive Noise Cancellation Techniques in Sigma-Delta Analog-to-Digital Converters*, © 2007 IEEE, 1549-8328, 10 pages.
A. Klein, Chapter 2, Linear Feedback Shift Registers, © 2013 Springer-Verlag, London 2013, 10.1007/978-1-4471-5079-4, 44 pages.
Bernard Widrow et al., *Adaptive Noise Cancelling: Principles and Applications*, Mar. 24, 1975, 26 pages.

\* cited by examiner

ADAPTIVE DIGITAL QUANTIZATION NOISE CANCELLATION FILTERS FOR MASH ADCS

PRIORITY DATA

This is a non-provisional patent application receiving benefit from US Provisional Patent Application, entitled, ADAPTIVE DIGITAL NOISE CANCELLATION FILTERS FOR MASH ADCS (filed on Dec. 17, 2015, Ser. No. 62/269,085). The US Provisional patent application is hereby incorporated by reference in its entirety.

TECHNICAL FIELD OF THE DISCLOSURE

The present disclosure relates generally to analog-to-digital converters (ADCs) and, more particularly, to adaptive digital quantization noise cancellation filters for multi-stage noise shaping delta sigma ADCs.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

For continuous-time multi-stage noise shaping analog-to-digital converters (CT MASH ADCs), quantization noise cancellation often requires accurate estimation of transfer functions, e.g., a noise transfer function of the front end modulator and a signal transfer function of the back end modulator. To provide quantization noise cancellation, digital quantization noise cancellation filters adaptively tracks transfer function variations due to integrator gain errors, flash-to-DAC timing errors, as well as the inter-stage gain and timing errors. Tracking the transfer functions is performed through the direct cross-correlation between the injected maximum length linear feedback shift registers (LFSR) sequence and modulator outputs and then corrects these non-ideal effects by accurately modeling the transfer functions with programmable finite impulse response (PFIR) filters.

Designing Analog-to-Digital Converters (ADCs)

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Figure 1:
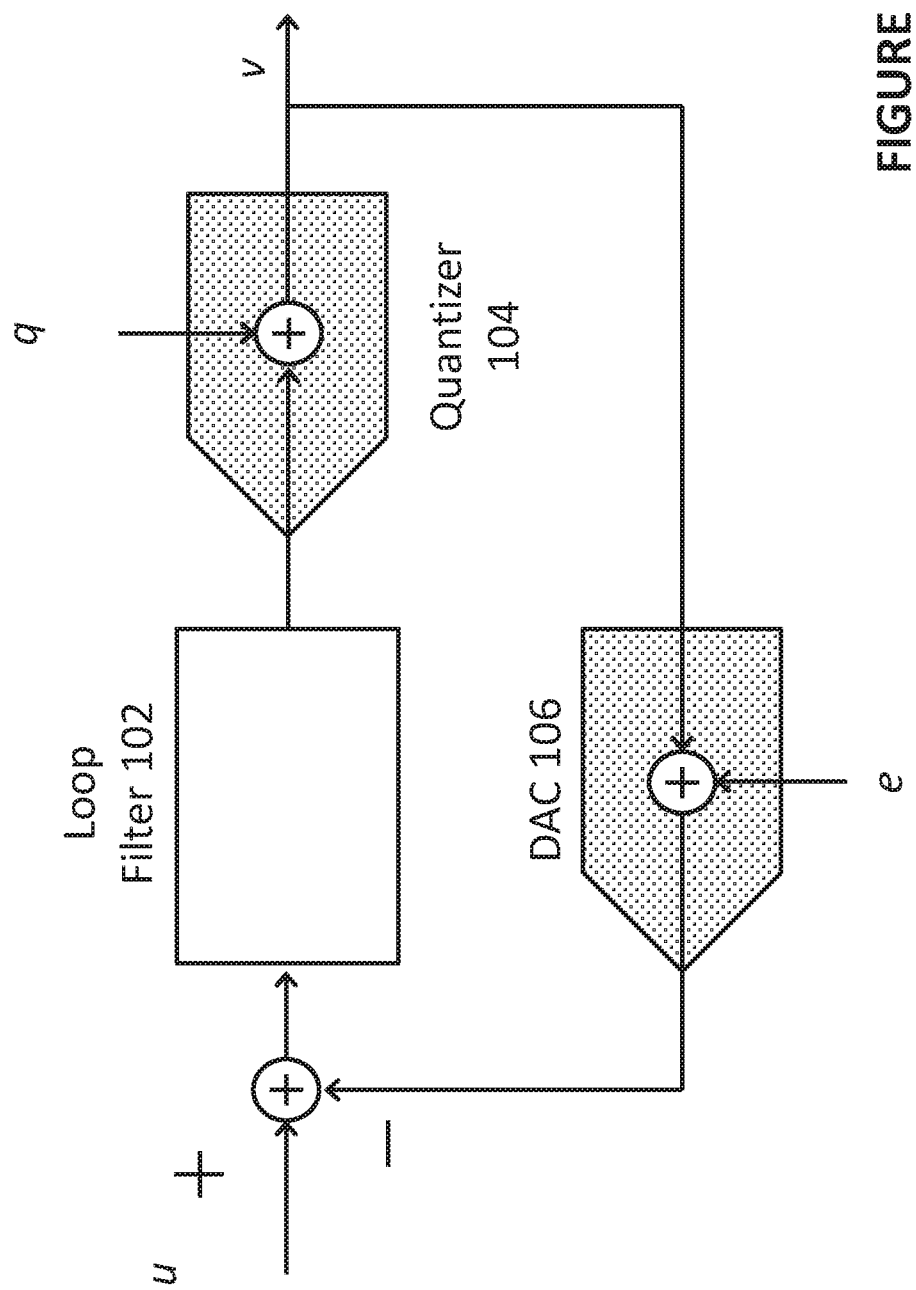
FIG. 1 is an illustrative system diagram of a delta sigma analog-to-digital converter (DS ADC)

ADCs based on delta-sigma (DS) modulation (referred to herein as "DS ADCs") have been widely used in digital audio and high precision instrumentation systems. FIG. 1 is an illustrative system diagram of a delta sigma analog-to-digital converter (DS ADC), or sometimes referred herein as a delta sigma modulator. The DS ADC includes loop filter 102, quantizer 104, and feedback digital-to-analog converter (DAC) 106 (i.e., a DAC in the feedback path of the DS ADC).

A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., Quantizer 104) to form a higher-resolution digital output. Loop filter 102, having one or more integrators, may be included to provide error feedback for the DS ADC and to help shape the noise from the quantizer 104 out of baseband to higher frequencies. The error is usually generated by taking the difference between the original analog input signal u and a reconstructed version of the original analog input signal generated using the feedback DAC 106 (where digitized signal v is converted back into an analog signal). One key characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog-to-digital conversion. Due to its popularity, many variations on the DS ADC and structures employing the DS ADC have been proposed.

The feedback DAC 106 is typically in a feedback configuration with an analog-to-digital converter (ADC). That is, the output of the ADC is fed to the input of the feedback DAC 106, and the output of the feedback DAC is fed back to the input path of the ADC. Generally speaking, the feedback DAC 106 is a multi-bit DAC which is implemented with a plurality of unit elements that are controlled by input bits to the feedback DAC. Each one of the unit elements, e.g., current steering cells, generate from the input digital code v fed to the feedback DAC 106 a part of analog output signal of the feedback DAC. In some cases, these unit elements are referred to as DAC elements which make up the feedback DAC 106. The DAC elements are, in some cases, referred to as unit elements because to the current steering circuits are ideally steering the same amount of current to the output (i.e., the DAC elements are weighted the same or have the same weight).

Multi-Stage Noise Shaping Analog-to-Digital Converters (MASH ADCs)

Different variations on the DS ADC have been proposed to achieve various advantages suitable for a variety of systems. In some applications, DS ADCs have been adapted to meet power concerns, while some other DS ADCs have been adapted to reduce complexity. In some cases, DS ADCs have been adapted to meet precision concerns by providing increased control over errors and/or noise. For example, for applications with an emphasis on noise shaping, a higher order DS modulator may be used, i.e., more integrators and feedback paths are used in the loop filter for shaping even more of the quantization noise to high frequencies. Delta-sigma ADCs (e.g., FIG. 1) use the shaping of quantization noise combined with oversampling to trade off resolution with signal bandwidth. High-order noise shaping and multi-bit implementations allow for more aggressive tradeoffs, but at the risk of making the ADC unstable.

Multi-stage noise shaping (MASH) ADCs having multiple DS ADCs have been introduced. Generally speaking, MASH ADCs has a plurality of stages, e.g., a plurality of DS ADCs. In one example, a MASH ADC can have two stages, e.g., a front end and a back end. Each of the stages receive a respective analog input and outputs a respective digital output. In some cases, the stages receive the same analog output. In some cases, the stages receive different analog inputs. For instance, some MASH ADCs have a front-end and a back-end where inputs to each modulator differ. Some MASH ADCs have stages where the implementation of the stage may differ. MASH ADCs address the issue of unstability by relying on the cascading of individually stable delta-sigma modulators. However, MASH ADCs rely on the cancellation of quantization noise, which requires accurate matching between analog and digital transfer functions.

Generally speaking, MASH ADCs can include a plurality of stages (cascaded delta sigma modulators) for digitizing the signal and errors of the system in order to meet design requirements related to bandwidth, resolution, and the signal to noise ratios. One advantage of MASH ADCs is that the design cascades stable low-order loops while achieving the good performance of (potentially unstable) higher-order loops. In one example, the first stage generates, from the analog input signal, a digital output signal using a first ADC. The input to the quantizer in the first stage (or equivalently, the output from the first loop filter/integrator) can be subtracted from the first DAC analog output to yield the first stage quantization noise. The first stage quantization noise is digitized by the second stage. The result is that the first stage generates an analog signal representing its quantization noise, and the second stage quantizes the quantization noise of the first stage using a second ADC. The multi-stage approach allows the quantization noise to be reduced and thus allows the MASH ADC to achieve higher performance. If more stages are used, the input to the quantizer in the second stage (or equivalently, the output from the second loop filter or integrator) can be subtracted from the second DAC analog output to yield the second stage quantization noise which can be in turn quantized by a third stage. Input to the quantizer or output from the loop filter/integrator may be delayed by a delay element prior to the subtraction. The delay element can be provided match possible transconductance and group delay of a signal path used for generating the DAC analog output from the analog signal at the input of the delay element. To generate the final output of the MASH ADC, the respective outputs are combined. Effectively, the result is that the quantization noise of the first stage is suppressed by the second stage, and the quantization noise from the second stage is suppressed by the third stage (yielding the same suppression of noise as a single third-order loop, when three cascaded first-order loops are used).

Figure 2:
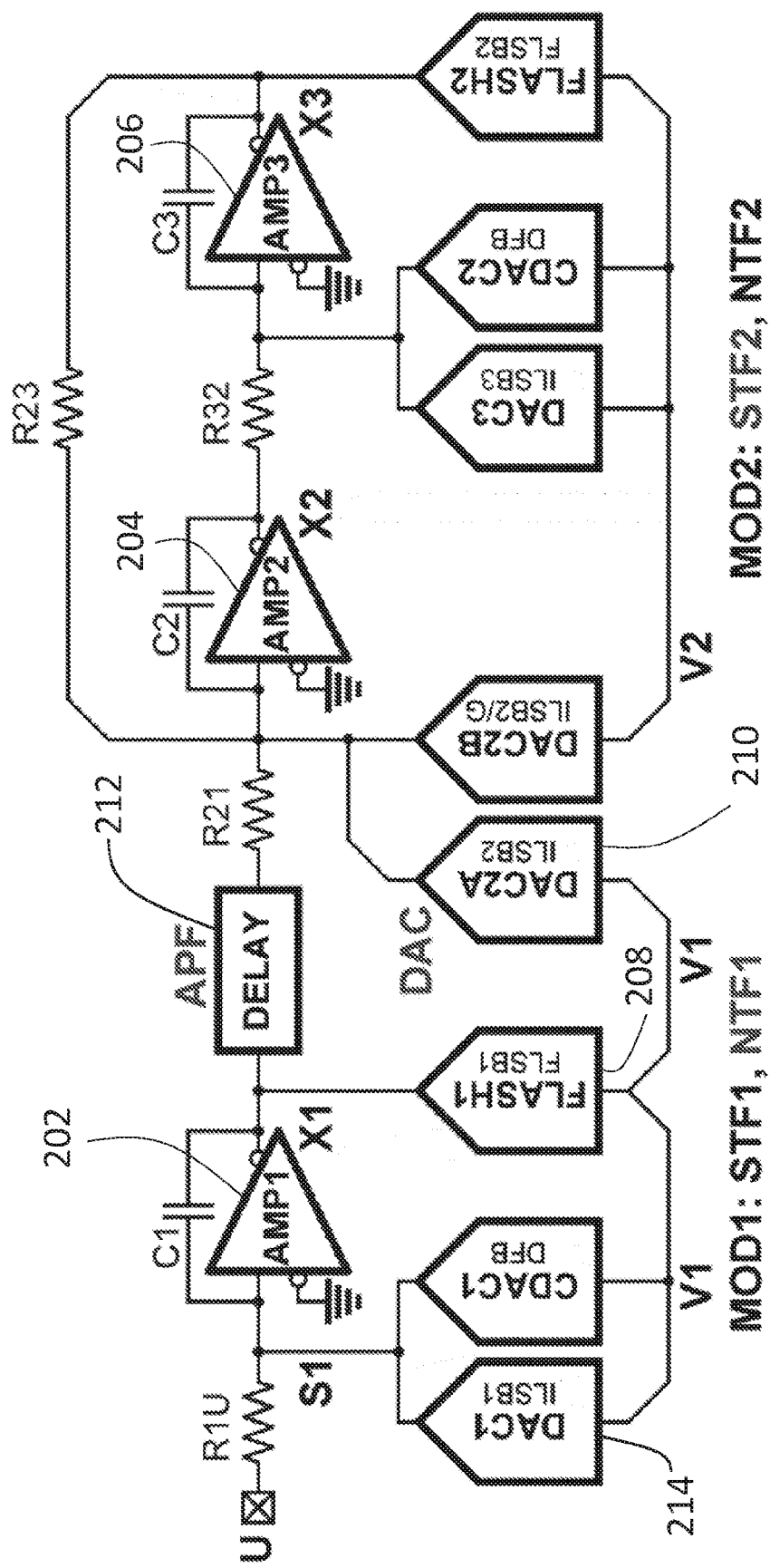
FIG. 2 is an illustrative system diagram of a 1-2 continuous time multi-stage noise shaping delta sigma analog-to-digital converter (CT MASH ADC), according to some embodiments of the disclosure.

FIG. 2 is an illustrative system diagram of a 1-2 continuous time multi-stage noise shaping delta sigma analog-to-digital converter (CT MASH ADC), according to some embodiments of the disclosure. In this example, the CT MASH ADC has two stages: a first order delta sigma modulator as the first stage (or front end, referred as $MOD_1$), and a second order delta sigma modulator as the second stage (or back end, referred as $MOD_2$). The first stage (or front end) generates a first digital output V1. The second stage (or back end) generates a second digital output V2. The order of the delta sigma modulator is determined by the number of integrators (number of feedback loops) in the stage. The first stage (front end) has only one integrator (e.g., integrator having opamp AMP1 202 generating output signal X1), thus it is a first order modulator. The second stage (back end) has two integrators (e.g., integrator having amplifier opamp AMP2 204 generating output X2, and integrator having opamp AMP3 206 generating output X3), thus it is a second order modulator. While this example is a 1-2 CT MASH ADC, the present disclosure is applicable to a variety of converters, including other CT MASH ADC architectures, discrete time (DT) MASH ADC architectures, hybrid CT-DT MASH ADC architectures, and CT, DT, or hybrid CT-DT pipeline modulators, etc.

Referring back to FIG. 2, the residue of the coarse quantization provided by the flash quantizer ("FLASH1" 208) inside the first order front end is fed to the second order back end and gets digitized by the second order back end. The output of the integrator in the first order front end (or input to the flash quantizer FLASH1 208), X1, is digitized by FLASH1 208 to generate digital output V1. Digital output V1 is provided as input to DAC "DAC2A" 210 to generate an analog output signal. The difference between X1 (or a delayed version of X1 at the output of the delay block 212) and the DAC2A 210 analog output yields the residue of the coarse quantization. The delay element 212 can be provided match possible transconductance and group delay of a signal path used for generating the DAC2A 210 analog output, i.e., the path through FLASH1 208 and DAC2A 210. The digital output of the front end V1 and the digital output of the back end V2 are properly combined in digital domain as the final digital word of the 1-2 CT MASH ADC.

Quantization Noise Cancellation

Figure 3:
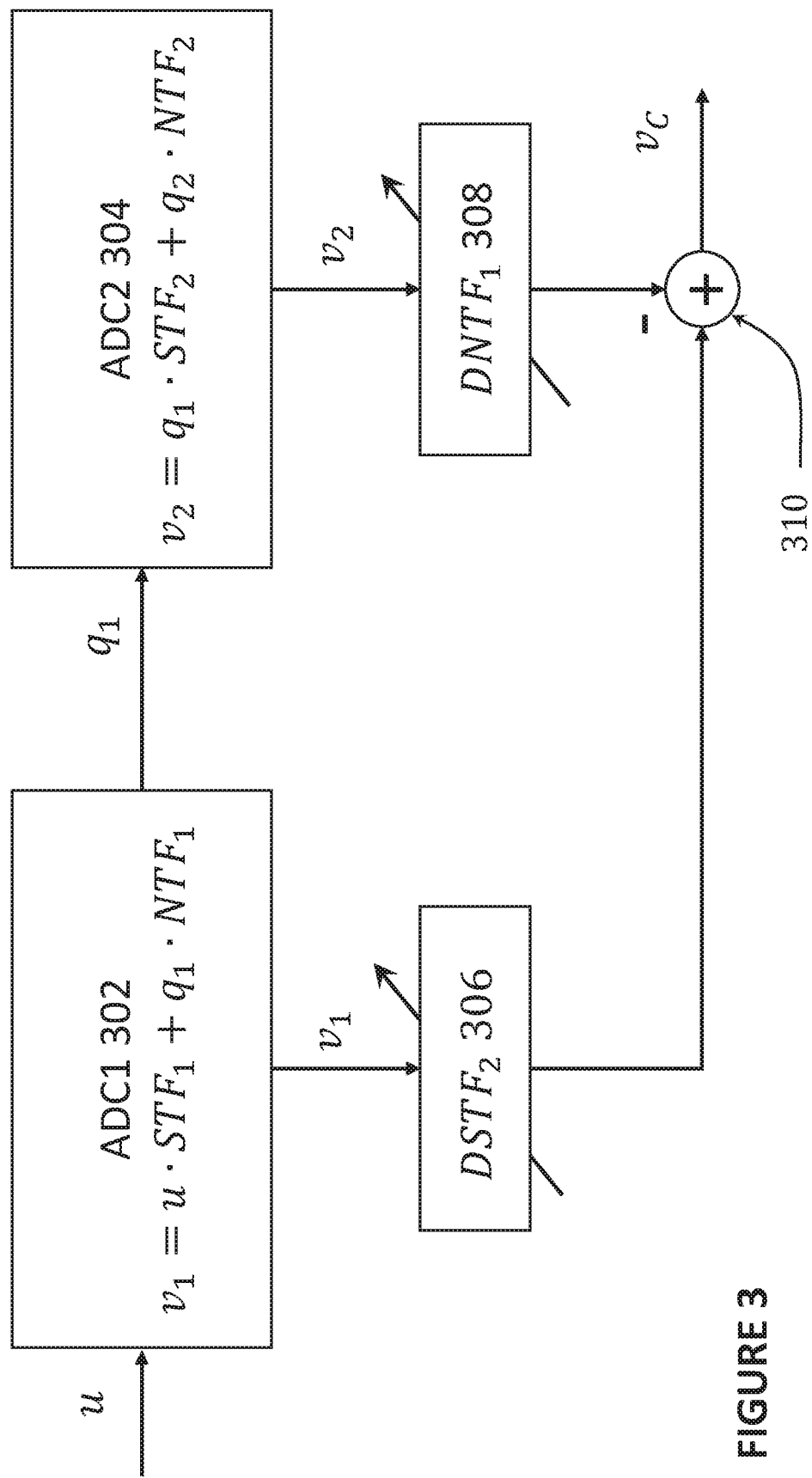
FIG. 3 shows (a high level diagram of) an exemplary two-stage MASH ADC with digital quantization noise cancellation, according to some embodiments of the disclosure.

While providing multiple stages increases complexity and cost, MASH ADCs can achieve remarkable performance, if the cancellation of quantization noise can be properly performed. FIG. 3 shows (a high level diagram of) an exemplary two-stage MASH ADC with digital quantization noise cancellation, which can provide cancellation of quantization noise. While the example shows two stages, it is envisioned by the disclosure that digital quantization noise cancellation can be applied to MASH ADCs with more than two stages. Two ADCs, ADC1 302, and ADC2 304, are arranged in cascade, representing the ADCs in two separate stages. Each ADC has a signal transfer function (STF), $STF_1$ and $STF_2$, from its input to its output. The quantization noise q introduced by ADC1 302 appears at its output. $q_1=u-v_1$ is the quantization noise of ADC1 302; $q_2$ is the quantization noise of ADC2 304. The quantization noise is shaped by a noise transfer function (NTF) of the same stage. For instance, the quantization noise of the first stage $q_1$ is shaped by the noise transfer function of the first stage $NTF_1$. The quantization noise of the second stage $q_2$ is shaped by the noise transfer function of the second stage $NTF_2$. The transfer functions denoted by $DSTF_2$ 306 and $DNTF_1$ 308 correspond to digital implementations or estimations of their corresponding analog counterparts, $NTF_2$ and $NTF_1$. $DSTF_2$ and $DNTF_1$ are discrete-time transfer functions or equivalent discrete-time representations of continuous-time transfer functions. After the digital outputs v1, v2 of the two-stages are filtered by the $DSTF_2$ 306 and $DNTF_1$ 308 respectively, the digital signals are combined, e.g., by summing node 310 (or some other suitable summing circuit or adder), to generate a final digital output vc.

For the two-stage MASH ADC of FIG. 2, the combined output $v_c$ is given as:

$$vc = v_1 DSTF_2 - v_2 DNTF_1 = uSTF_1 DSTF_2 + q_1 \\ (NTF_1 DSTF_2 - STF_2 DNTF_1) - q_2 NTF_2 DNTF_1 \quad (1)$$

If the analog and digital transfer functions are made to match perfectly, i.e., if $DSTF_2=STF_2$ and $DNTF_1=NTF_1$ the above expression simplifies to:

$$vc = uSTF_1 DSTF_2 - q_2 NTF_2 DNTF_1 \quad (2)$$

Therefore, the quantization noise from the first stage q1 is cancelled out (no longer appears in the combined output vc) by means of providing the digital filters $DSTF_2$ 306 and $DNTF_1$ 308 filtering the digital outputs v1, v2 of the two-stages respectively. The quantization noise from the second stage q2 is shaped by the product of the two noise transfer functions (i.e., $NTF_2 DNTF_1$). If the analog and digital transfer functions do not match, the quantization noise from the first stage would appear at the combined output shaped by the ($NTF_1 DSTF_2 - STF_2 DNTF_1$) term. This undesirable effect is called quantization noise leakage, and can significantly degrade the achievable Signal-to-Noise Ratio (SNR) performance of the ADC.

Various techniques have been explored to reduce quantization noise leakage. In some cases, the analog transfer functions can be made as accurate and predictable as possible, but this approach is only possible for certain low speed implementations using switched-capacitor circuits (discrete time implementations). A more effective technique is to design lower-performance analog circuits, estimate what their real/actual signal and noise transfer functions are, and compensate for their shortcomings with programmable digital filters (as shown by the arrows for $DSTF_2$ 306 and $DNTF_1$ 308 filters of FIG. 3). This technique works well as long as the analog circuits are sufficiently linear and are time invariant. The estimation of transfer function impulse responses may be performed in the background by cross-correlating the ADC outputs with a known random signal injected at the quantizer of the first stage, or in the foreground by injecting known signals. The programmable digital filters or cancellation filters can be implemented as programmable finite-impulse response (FIR) filters.

Estimating Transfer Functions: One-Bit Dither Signal Injection and Cross-Correlation The continuous-time MASH modulator gains popularity because of its robust stability and great potential for low power, wide bandwidth, and high dynamic range. As explained above, the performance of the MASH structure depends on how well the digital transfer function matches the analog transfer functions. Generally, least means squares approaches (closed loop techniques) are used to improve transfer function matching. However, such approaches can be inadequate in some cases.

To ensure the digital transfer functions accurately to match the analog counterparts, digital cancellation filter adaptively tracks the front-end and back-end transfer functions variations due to integrator gain errors, flash-to-DAC timing errors, as well as the inter-stage gain and timing errors. Also as explained above, the estimation of transfer function impulse responses may be performed in background by cross-correlating the ADC outputs with a particular signal injected at the quantizer ("FLASH1" 208) of the first stage (e.g., a dither signal), or in foreground by injecting known signals. The cross-correlation can be performed using dedicated hardware and/or an on-chip microprocessor executing instructions to determine filter coefficients based on the cross-correlation. Through direct cross-correlation between an injected maximum-length linear feedback shift registers (LFSR) sequence and modulator outputs, non-ideal effects can be corrected by accurately modeling the transfer functions with programmable finite impulse response (PFIR) filters.

Referring back to the examples shown in FIGS. 2 and 3, the signal transfer function of the back end $STF_2$ and the noise transfer function of the front end $NTF_1$ are estimated to implement the digital quantization noise cancellation filters $DSTF_2$ and $DNTF_1$. The digital cancellation filters can be implemented as programmable finite-impulse response (FIR) filters (shown as $DSTF_2$ and $DNTF_1$ in FIG. 2). As a result, the programmable FIR filters can adapt and ensure quantization noise cancellation can be performed with minimal quantization noise leakage.

Cross-correlation, as used herein, refers to a measurement of similarity between a pair of signals:

$$r_{xy}[l] = \sum_{n=-\infty}^{\infty} x[n]y[n-l]$$

L indicates lag, and n is the time index. Accordingly, the cross-correlation is the accumulation of signal multiplications in time, equivalent to the convolution of x[n] with y[−n], or multiplication $r_{xy}[l]=F^{-1}\{X[k]\cdot Y^*[k]\}$ where k is frequency. Cross-correlation is a sliding dot product or sliding inner-product of the two digital signals.

Referring back to the example in FIG. 2, there can be 5-bit 2's-complement outputs V1, and V2 from the front end and back end respectively. In addition to 5-bit V1, it is possible to inject one dither bit to be combined with V1 for the digital data path. This dither bit allows transfer functions to be estimated. This bit represents a half-LSB strength signal. Specifically, if the dither bit is 1, ½ will be added to the 5-bit V1, if it is 0, −½ will be added to the 5-bit V1. In the other words, it is possible to add 00000.1 (2's complement) to V1 if dither bit is 1, and add 11111.1 (2's complement) to V1 if the dither bit is 0.

Figure 4:
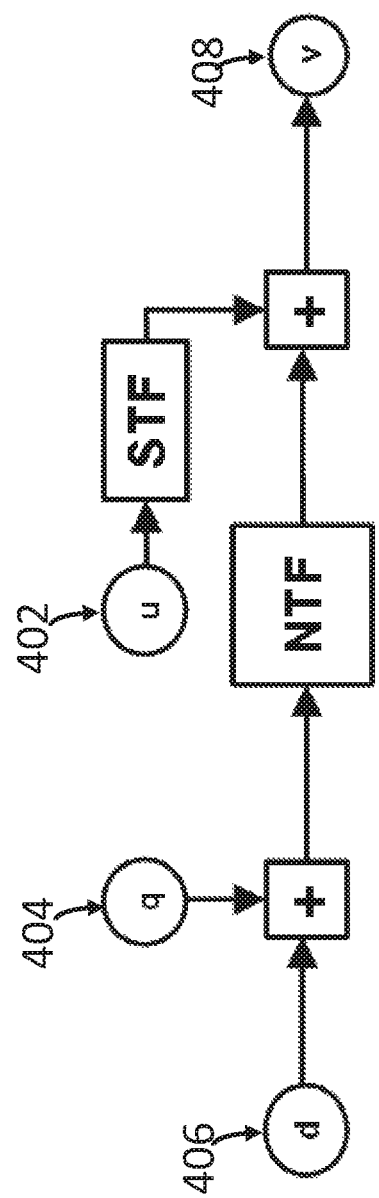
FIG. 4 shows a model for a single loop modulator having a dither signal injected at the quantizer, according to some embodiments of the disclosure.

One bit dither signal generated through a maximum-length LFSR sequence can be injected at the front-end quantizer input or preferably, the front-end quantizer output. The following outlines a basic framework for a single modulator. The concepts can be applied to a MASH, such as the 1-2 CT MASH ADC of FIG. 2. FIG. 4 shows a model for a single loop modulator having a dither signal injected at the quantizer (e.g., "FLASH1" 208 of FIG. 2), according to some embodiments of the disclosure. The input signal, quantization error, and dither signal are represented by u 402, q 404, and d 406 respectively. NTF and STF stand for noise and signal transfer functions. The modulator output v 408 is thus given by:

$$v(n)=ntf(n)\otimes d(n)+ntf(n)\otimes q(n)+stf(n)\otimes u(n)$$

Taking correlation between the dither signal and the modulator output, it is possible to obtain:

$$r_{dv}(l)=ntf(n)\otimes r_{dd}(l)+ntf(n)\otimes r_{dq}(l)+stf(n)\otimes r_{du}(l)$$

And for the maximum length LFSR sequence, the auto-correlation is:

$$r_{dd}[l] \approx \begin{cases} 1 & l=0 \\ 1/(2^N) & l \neq 0 \end{cases}$$

The dither signal preferably has the above autocorrelation (which approaches that of an impulse function, or in other words, appears like an impulse response with a peak of 1 when l=0, and has very small values when l≠0) such that the impulse response of the noise transfer function can be easily obtained from the cross-correlation of the dither signal and the modulator output. This outcome is due to the cross-correlation $r_{dq}(l)$ between the dither signal and the uncorrelated quantization errors, as well as the cross-correlation $r_{du}(l)$ between the dither signal and the input signal being nearly zero. Therefore, it can be derived that:

$$ntf(l)\approx r_{dv}(l)$$

When the dither signal is injected at the quantizer of the front-end modulator, it can be seen from the above that the cross-correlation of the dither signal and the modulator output V1 of the front-end modulator can yield the noise transfer function of the front end (e.g., $NTF_1$ referenced in relation to FIG. 3). Referring back to the 1-2 CT MASH ADC of FIG. 2, the quantization errors generated through DAC2A and the delayed input for the quantizer (through the DELAY element 212 and R21) are scaled up and fed to the second stage. It can be seen that the dither signal injected at the quantizer of the front-end modulator would also allow the signal transfer function of the back end (e.g., $STF_2$ reference in relation to FIG. 3) to be determined as well, based on the cross-correlation of the dither signal and the digital output V2 of the back-end modulator. Note that the estimation of the signal transfer function estimation of the back end also tracks inter-stage gain and timing error.

Figure 5:
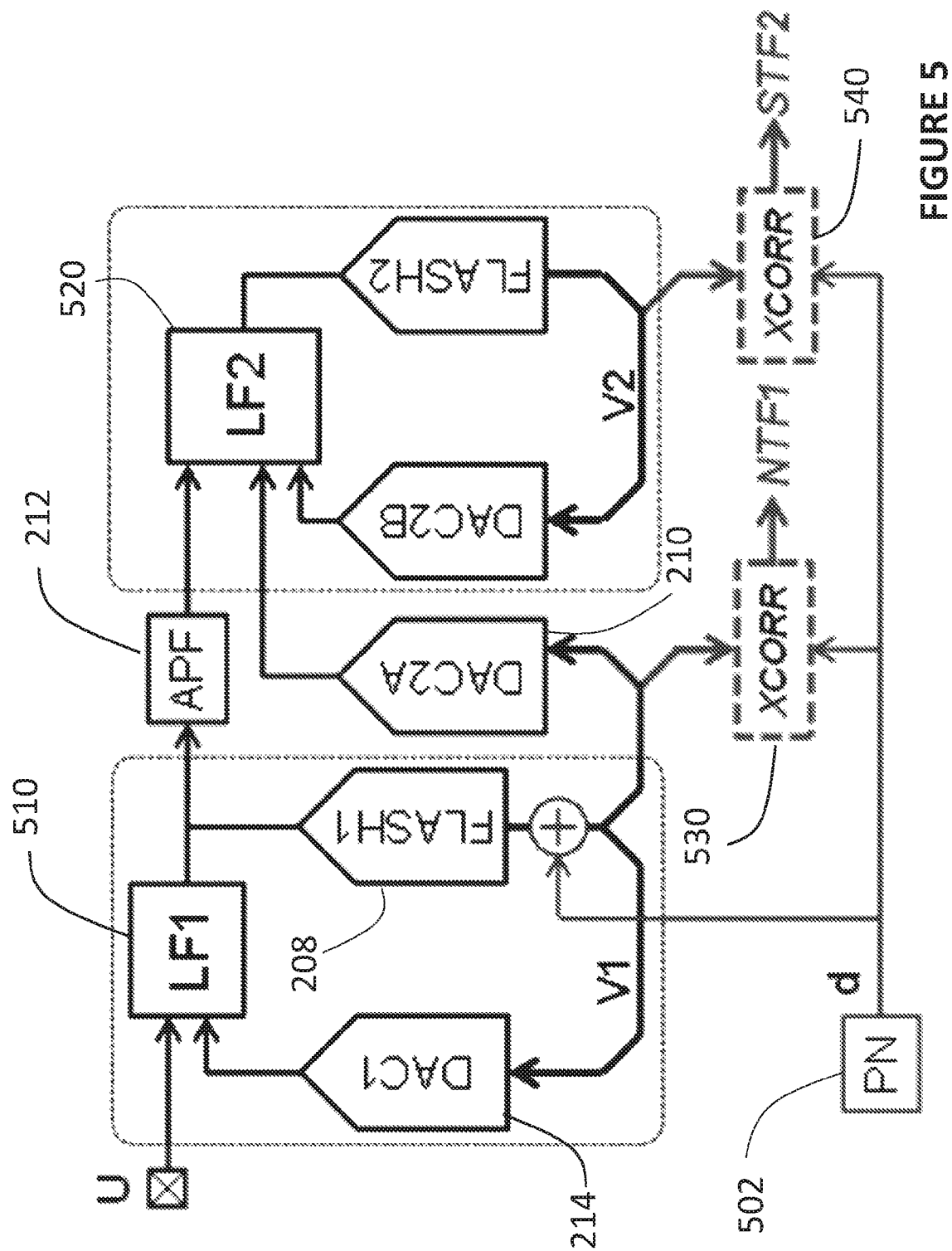
FIG. 5 shows an exemplary two-stage MASH ADC with cross-correlation hardware blocks, according to some embodiments of the disclosure.

FIG. 5 shows an exemplary two-stage MASH ADC with cross-correlation hardware blocks, according to some embodiments of the disclosure. The first stage has a loop filter "LF1" 510, and the second stage has loop filter "LF2" 520. The circuits of the two-stage MASH ADC of FIG. 5 is similar to the architecture shown in FIG. 2, but with the addition of cross-correlation blocks "XCORR" 530 and "XCORR" 540. As illustrated by this example, a one bit dither signal d generated through a maximum-length LFSR sequence by a PN block 502 is injected at the front-end quantizer ("FLASH1" 208") output. The length of the dither sequence d in FIG. 5 generated by PN block 502 can be programmable (e.g., between 20 and 41 bits). A PN block can also be referred to as a dither block.

The cross-correlation block "XCORR" 530 can determine the cross-correlation function between the dither signal d and the front-end modulator output V1. The cross-correlation function is the front-end modulator's noise transfer function ($NTF_1$). Similarly the cross-correlation block "XCORR" 540 can determine the cross-correlation function between the dither signal d and the back-end modulator output V2. The cross-correlation function is the back-end modulator's signal transfer function ($STF_2$), and the cross-correlation function can also include the inter-stage gain and timing errors. Accordingly, the information determined based on the cross-correlation can yield an estimate of the signal transfer function of the back end $STF_2$ and the noise transfer function of the front end $NTF_1$ and digital quantization noise cancellation filters $DSTF_2$ and $DNTF_1$ (referenced in FIG. 3) can be programmed based on the estimated transfer functions.

Note that the present disclosure describes an open-loop technique for directly estimating transfer function (as opposed to a closed-loop technique). Specifically, the open loop technique observes the dither signal and the modulator output to estimate the transfer function. The open-loop technique is advantageous since convergence can be faster with a one shot estimation. The update equations for the open-loop estimation can be more complex, but the open-loop technique can track changes in the signal transfer function over time where coefficients for the estimated transfer function can be fully recalculated each time the open-loop technique is executed. The open-loop technique can be more flexible than a closed-loop technique.

Cross-Correlation Hardware and on-Chip Microprocessor

Figure 6:
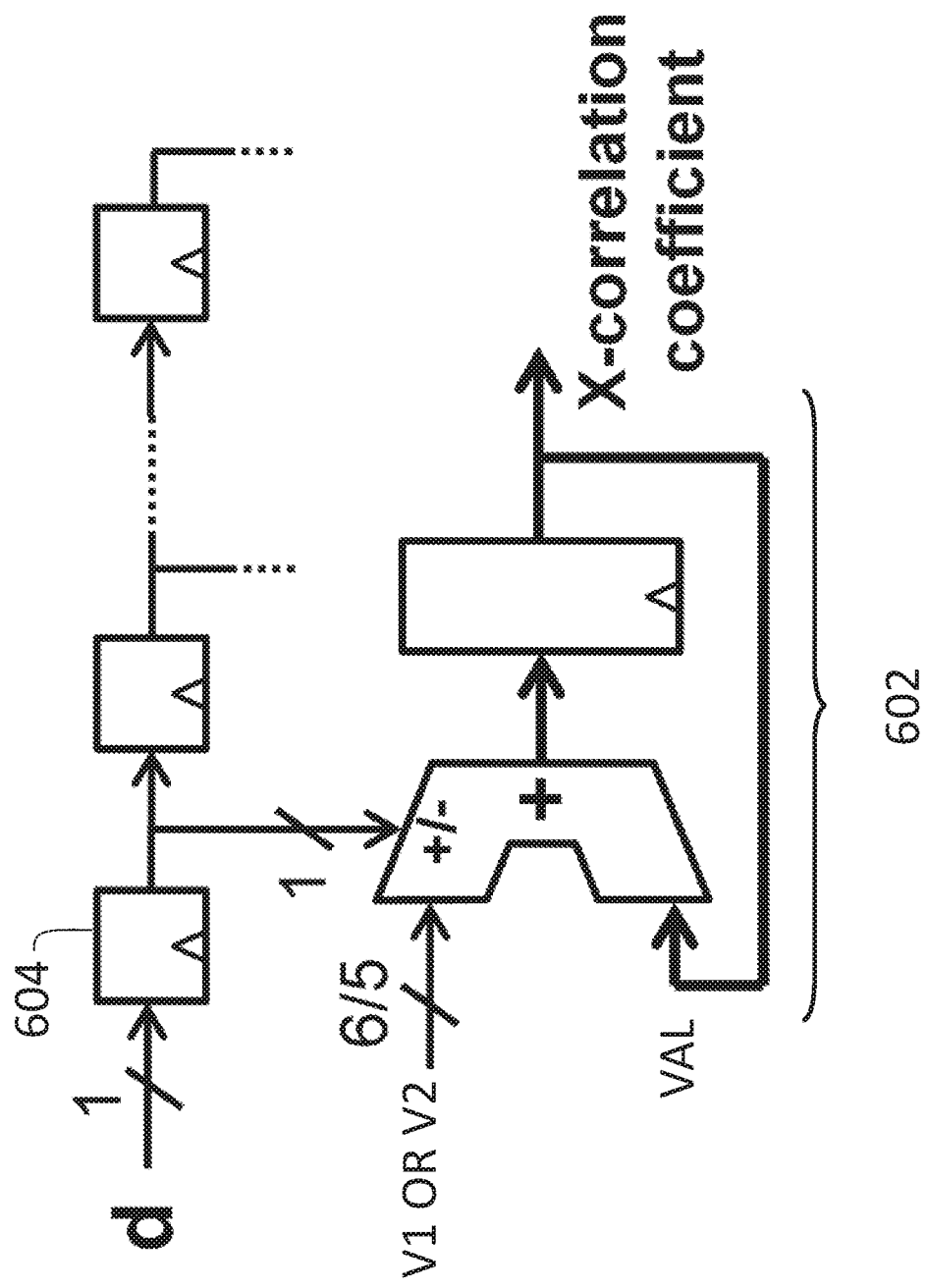
FIG. 6 shows an exemplary cross-correlation hardware block, according to some embodiments of the disclosure.

The cross-correlation blocks ("XCORR" blocks 530 and 540) shown in FIG. 5 can operate at the full clock rate of the modulators. FIG. 6 shows an exemplary cross-correlation hardware block, according to some embodiments of the disclosure. In some embodiments, the cross-correlation block can be implemented as a number of correlators. A correlator can include an accumulator 602 (i.e., dedicated high speed hardware circuitry). In some embodiments, the correlator can include an accumulator 602 with a corresponding delay block 604 shown in FIG. 6). A plurality of correlators can be included in cascade.

The accumulator can include an adder for adding or subtracting the modulator output V1 or V2 (or a delayed version of the modulator output V1 or V2 depending on the position of the correlator) from an accumulated value "VAL" of the accumulator. Adding or subtracting of the modulator output can depend on the dither bit to generate a cross-correlation coefficient ("X-correlation coefficient") for further processing.

Depending on the length of the transfer function desired, a number of correlators can be implemented (i.e., the cross-correlation block can include a plurality of accumulators and a plurality of corresponding delay blocks). The number of such correlators may be dictated by the length of the impulse response of the estimated transfer function. If the transfer function is being implemented as an FIR filter, the number of correlators can be dictated by the number of taps in the FIR filter. For instance, if the transfer function is being implemented as a filter having 16 taps, 16 correlators (accumulators and delay blocks) can be included for the cross-correlation block.

In some cases, the cross-correlation hardware block can be shared between the estimation of first stage NTF and second stage STF including inter-stage gain and delay. Advantageously, one set of correlators (i.e., one cross-correlation block) can be used for estimating different transfer functions, e.g., via time domain multiplexing, thereby saving some area and potentially power consumption. Given that the transfer functions do not change very quickly, the number of correlation hardware blocks can be reduced to lower the power dissipation through time sharing.

Figure 7:
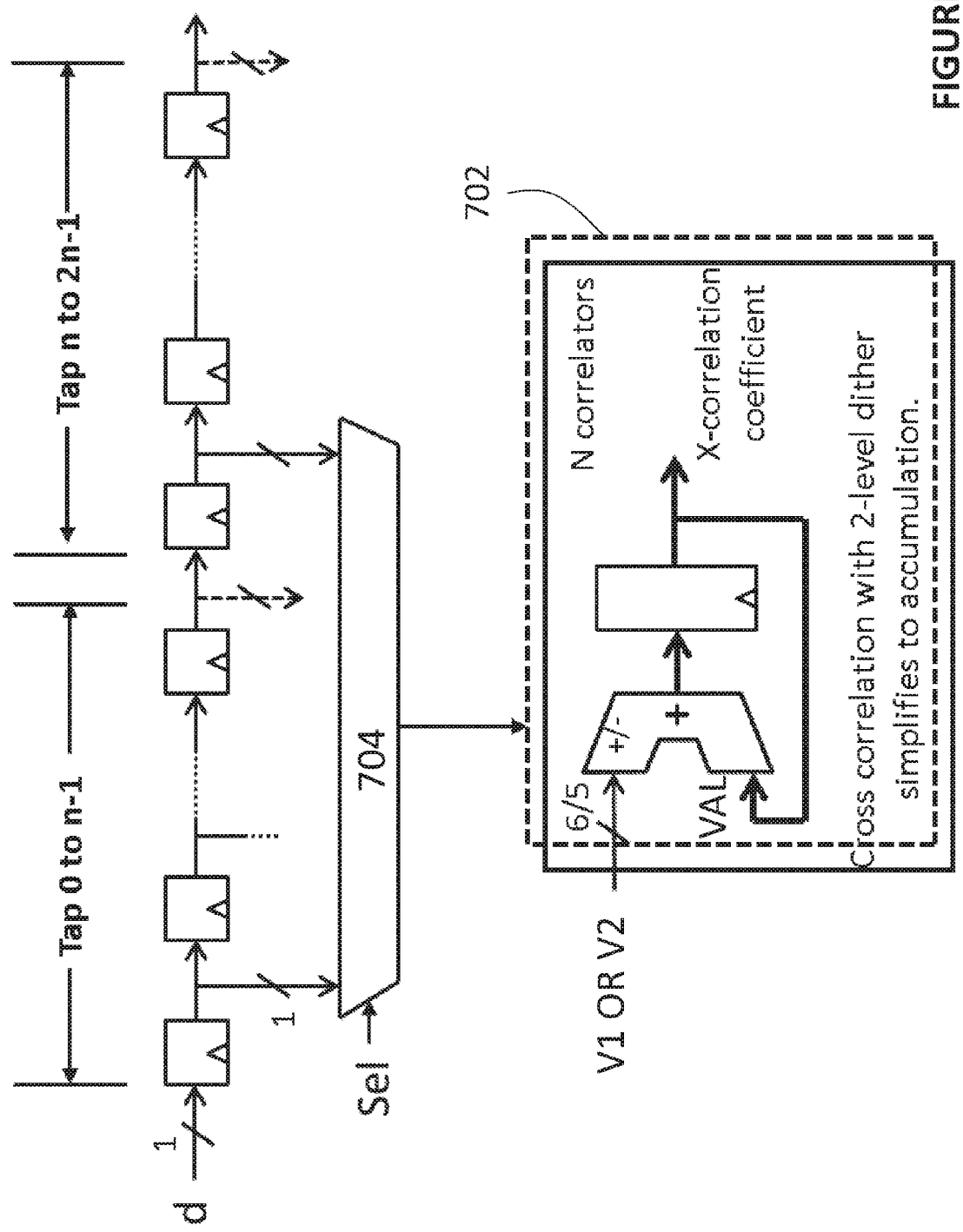
FIG. 7 illustrates time sharing within the cross-correlation hardware block, according to some embodiments of the disclosure.

Even within a single cross-correlation hardware block, the correlators (i.e., the accumulators) therein can also be time shared for different sets of taps in the cross-correlation block. Given the time invariance of a particular transfer function, the number of correlators can also be reduced (no longer has to be the full number of taps of the impulse response the cross-correlation block is aiming to estimate) to lower the power dissipation through time sharing. FIG. 7 illustrates time sharing within a single cross-correlation hardware block, according to some embodiments of the disclosure. If the transfer function has 2n taps, the first n taps (Tap 0 to n–1) can be estimated by the existing n correlators 704 during a first time period and then the same set of n correlators 704 can be used to learn the remaining n taps (Tap n to 2n–1) during a second time period. A multiplexer 704, controlled by selection signal "SEL" can select an appropriate dither signal value (dither signal value with the appropriate tap) to be provided to a correlator in the N correlators. The number of accumulators required are thus reduced by half in this example.

The cross-correlation hardware block can be enabled by an on-chip microprocessor executing instructions for estimating and updating coefficients for the programmable digital filters used for quantization noise cancellation. The cross-correlation hardware block can be triggered to perform correlation (i.e., accumulation) and sends a ready signal back to the microprocessor when the specified number of samples have been accumulated. During the accumulation, if the modulator reaches a defined over-range threshold value and the transfer-function estimation is no longer accurate, the cross-correlation block can be triggered to clear itself (by a signal from the on-chip microprocessor, or other interrupt signal), and sends a clear signal back to the on-chip microprocessor. The on-chip microprocessor can selects a particular cross-correlator function to be executed by the cross-correlator block (e.g., $NTF_1$ or $STF_2$ estimation, or which channel). The on-chip microprocessor can reset cross-correlators (to start new estimation, or if overload event). The on-chip microprocessor can select desired accumulation length and averaging. The on-chip microprocessor can reads results from correlations and/or estimations. The on-chip microprocessor can perform normalization (due to this being an open-loop technique). The on-chip microprocessor can perform decimation to reduce complexity. The on-chip microprocessor can load coefficients on digital filters for quantization noise cancellation.

Decimation to Reduce Complexity

Figure 8:
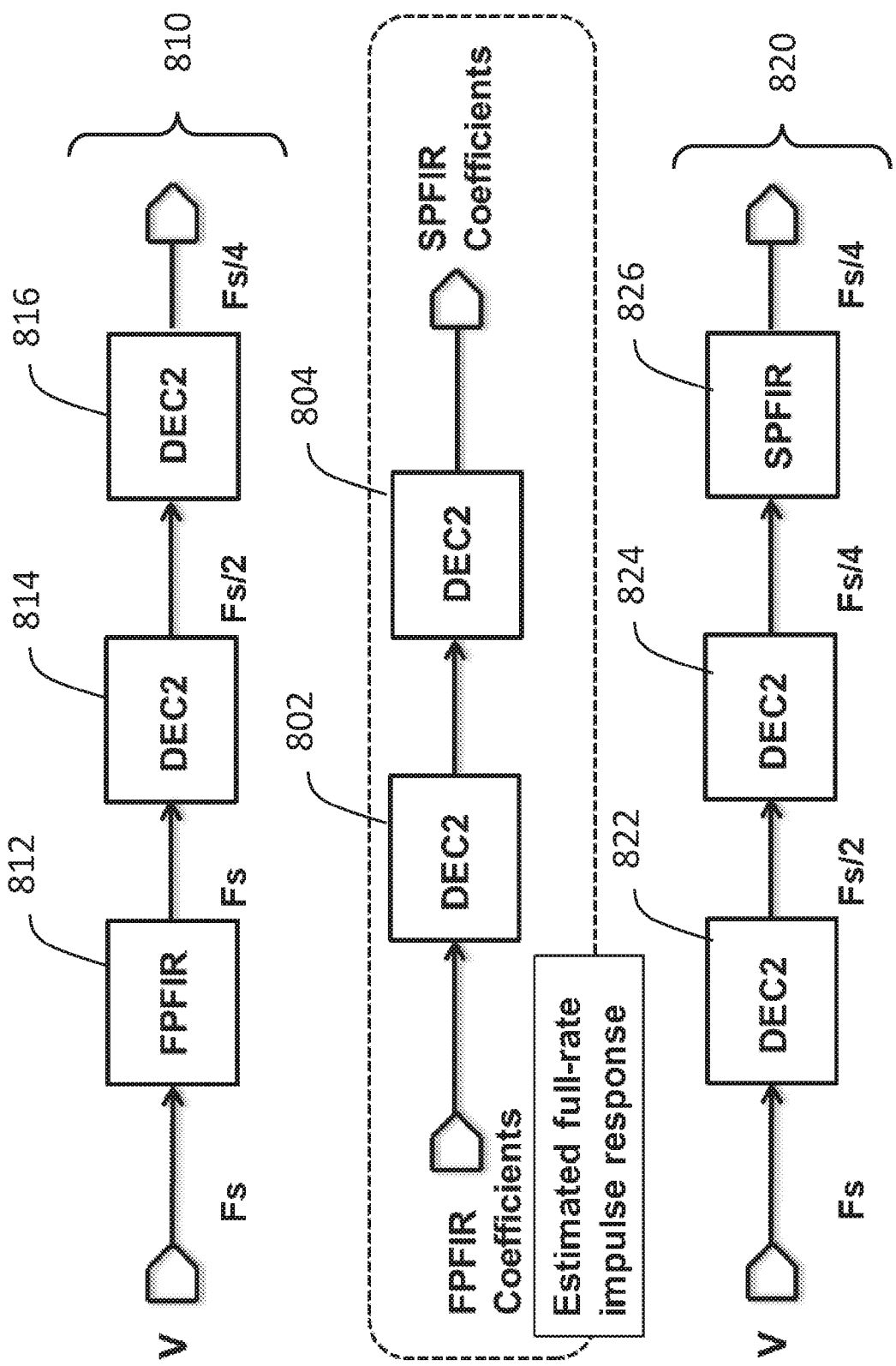
FIG. 8 illustrates decimation to a lower clock domain, according to some embodiments of the disclosure.

To reduce the implementation complexity, the programmable FIR filters (PFIRs) which model the NTF and STF in the data path can be decimated to a lower clock domain to enable the multiply-accumulate (MAC) operations of the filters to be performed with fewer taps. FIG. 8 illustrates decimation to a lower clock domain, according to some embodiments of the disclosure. Signal chain 810 processes the modulator output V using the full rate PFIR coefficients (shown as "FPFIR" block 812), and the signal is subsequently decimated to a lower clock domain by two cascaded decimated-by-2 HBFs (HBF=half band filters, decimation by 2) (shown as "DEC2" 814 and "DEC2" 816). Signal chain 820 processes the modulator output V first by decimating to a lower clock domain, via two cascaded decimated-by-2 HBFs (shown as "DEC2" 822 and "DEC2" 824). The decimated signal is subsequently filtered by slow-rate PFIR coefficients (shown as "SPFIR" block 826). The signal chain 810 is equivalent to the signal chain 820, and illustrates that decimation is possible for reducing complexity.

In this example, to convert the full rate PFIR coefficients of the "FPFIR" block 812 to decimated PFIR coefficients of the "SPFIR" block 826 operating at, e.g., Fs/4, the estimated transfer function impulse response, i.e., the full rate PFIR coefficients of the "FPFIR" block 812 can be filtered through the two cascaded decimated-by-2 HBFs (HBF=half band filters, decimation by 2). The cascaded filters are shown as "DEC2" 802 and "DEC2" 804. The decimation can be performed by an on-chip microprocessor executing instructions for decimating the estimated transfer function impulse response coefficients (FPFIR coefficients) and obtaining decimated coefficients (SPFIR coefficients). Slow-rate SPFIR multiplications can be performed at a lower rate with fewer taps (but with more bits in multiplier and multiplicand). Depending on the level of decimation desired, different number of or kinds of cascaded decimation filters can be used.

Figure 9:
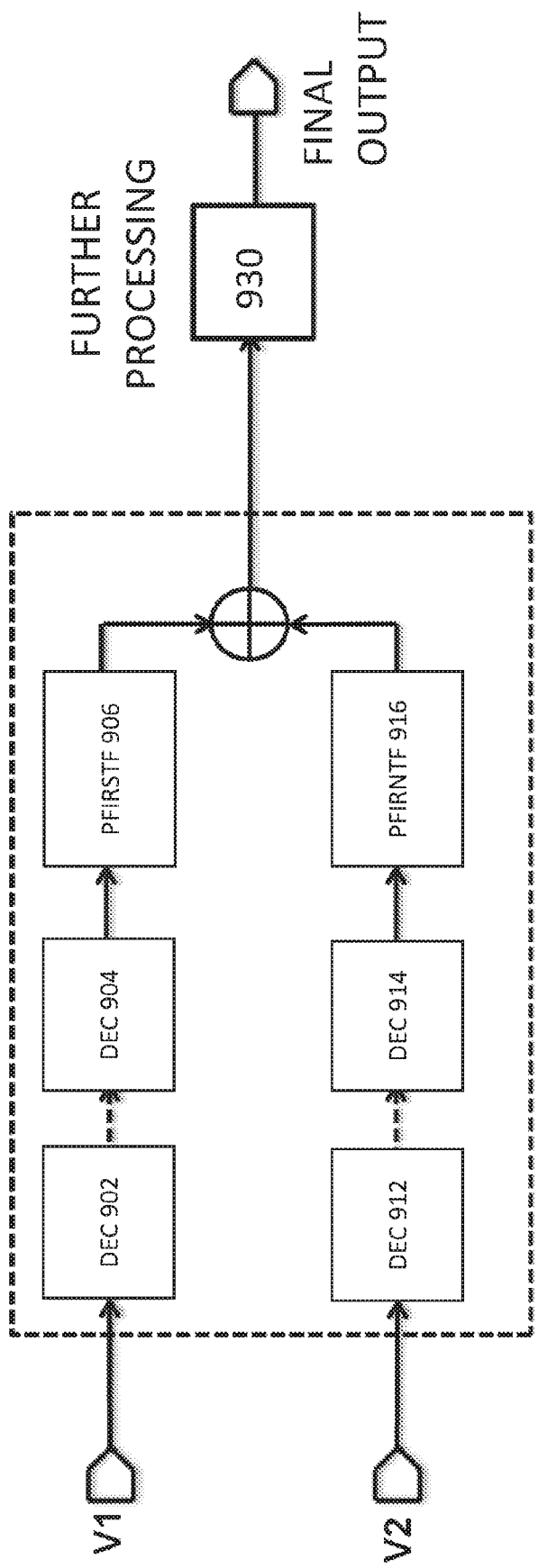
FIG. 9 shows digital quantization noise cancellation signal paths for the MASH ADC having decimation, according to some embodiments of the disclosure.

FIG. 9 shows digital quantization noise cancellation signal paths for the MASH ADC having decimation, according to some embodiments of the disclosures. The top signal path has one or more (cascaded) decimation filters (e.g., blocks 902 and 904) for processing and decimating the modulator output of the front end V1. PFIRSTF 906 represents the programmable FIR filter for implementing the STF of the back end ($DSTF_2$ of FIG. 3, or the transfer function from the front end quantizer input to the back end modulator output having APF+Gain+$STF_2$ seen in FIG. 2). The coefficients of PFIRSTF 906 may be decimated and operates at a slow-rate (not full rate). The bottom signal path also has one or more (cascaded) decimation filters (e.g., blocks 912 and 914) for processing and decimating the modulator output of the back end V2. PFIRNTF 916 represents the programmable FIR filter for implementing the NTF of the front end ($DNTF_1$ of FIG. 3). The coefficients of PFIRNTF 916 may be decimated and operates at a slow-rate (not full rate).

Both filters, i.e., PFIRSTF 906 and PFIRNTF 916, are implemented after decimators so that the filters can run at a much slower rate to reduce complexity. The top and bottom signal paths includes decimation (blocks 902, 904, 912, and 914) such that the PFIR coefficients operating at the lower clock domain can be applied to carry out the quantization noise cancellation previously described with respect to FIG. 3. For instance, both PFIRSTF and PFIRNTF filters can be implemented after the decimators with only 12 taps each. The outputs of the PFIRSTF and PFIRNTF filters are combined and provided to another block for further digital processing 930 to generate the final output of the MASH ADC.

Method for Determining Filter Coefficients

Figure 10:
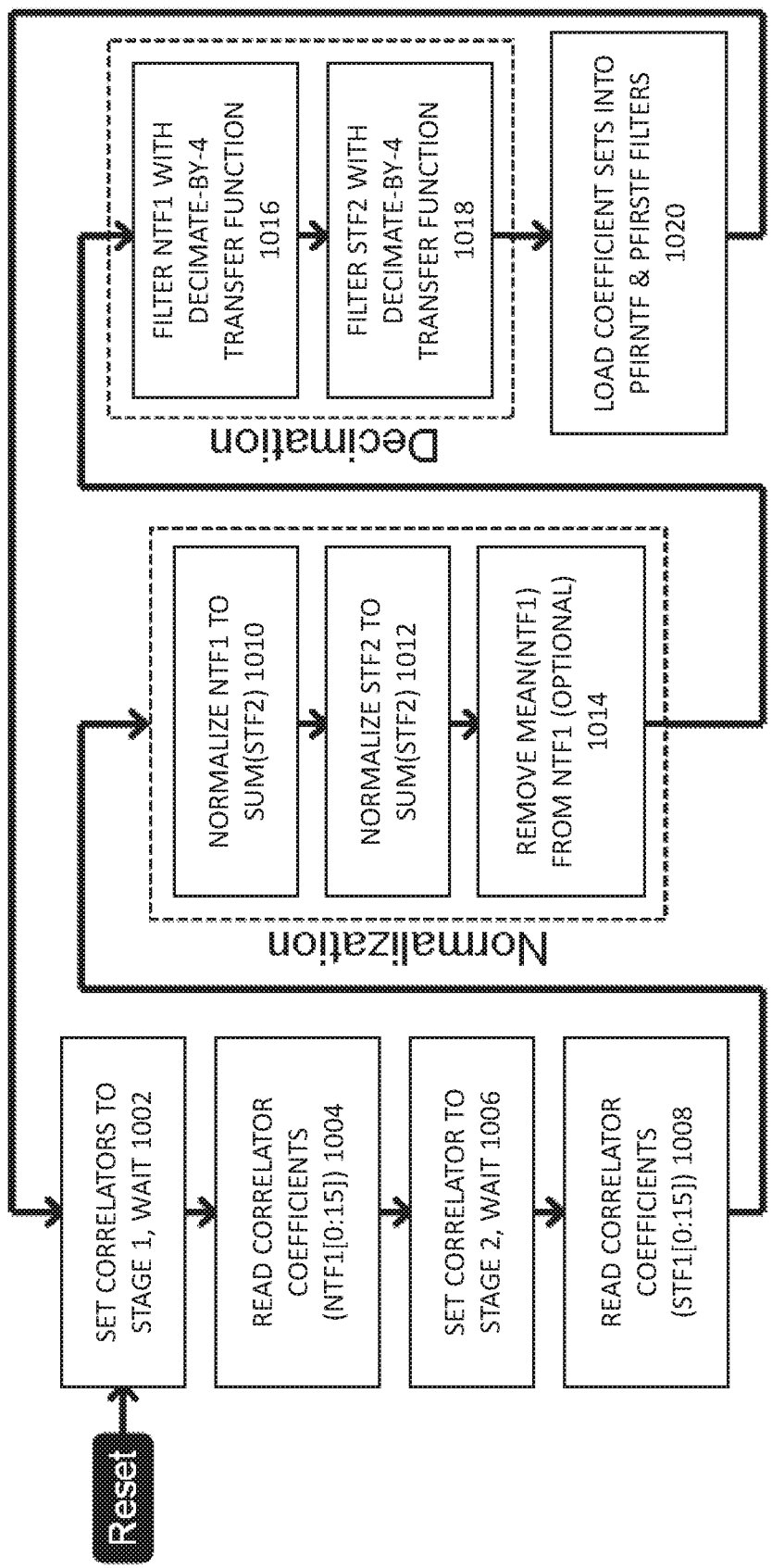
FIG. 10 is a flow diagram illustrating a method for determining digital filter coefficients which tracks the signal transfer functions through cross-correlation, according to some embodiments of the disclosure.

FIG. 10 is a flow diagram illustrating a method for determining digital filter coefficients which tracks the signal transfer functions through cross-correlation, according to some embodiments of the disclosure. The method includes setting the correlators to execute and reading correlator results from the correlators. The method can include normalization and decimation, if applicable. After the final coefficients are determined, the method includes loading the coefficients to the programmable digital filters. While the cross-correlation hardware block comprises dedicated hardware, an on-chip microprocessor executing instructions can be implemented to read from the cross-correlation hardware to determine the filter coefficients of the PFIR filters.

The following outlines one example of the method illustrated in FIG. 10, where a cross-correlation hardware block having 16 correlators are provided with a multi-stage analog-to-digital converter (e.g., MASH ADC, pipeline ADC). The 16 correlators of a single cross-correlation hardware block, in this example, are shared between two stages of the multi-stage ADC to reduce the amount of hardware needed to find the transfer functions of the two stages.

The hardware is configured, e.g., by an on-chip microprocessor, to start the NTF1 estimation process. In task 1002, the 16 correlators of a cross-correlation hardware block is set to perform cross-correlation for stage 1, i.e., a first stage of the multi-stage ADC. Cross-correlation is performed between the dither signal (e.g., injected at the flash quantizer of the first stage) and the digital output of the first stage. In task 1004, once cross-correlation is complete, the 16 cross-correlator results XCORR[0:15] can be read and the results form the coefficients of the NTF1 estimation, i.e., noise transfer function of the first stage, or NTF1[0:15].

The hardware is also configured, e.g., by an on-chip microprocessor, to start the STF2 estimation process. In task 1006, the 16 correlators of a cross-correlation hardware block is set to perform cross-correlation for stage 2, i.e., a second stage of the multi-stage ADC. Cross-correlation is performed between the dither signal (e.g., injected at the flash quantizer of the first stage) and the digital output of the second stage. In task 1008, once cross-correlation is complete, the 16 cross-correlator results XCORR[0:15] can be read and the results form the coefficients of STF2 estimation, i.e., signal transfer function of the second stage or STF2[0:15].

In some implementations, the transfer functions are normalized. In task 1010, NTF1 coefficients can be normalized to the sum of STF2 coefficients, which is a gain coefficient. In other words, NTF1 coefficients can be divided by the gain coefficient. In task 1012, STF2 coefficients can be normalized to the sum of STF2 coefficients or gain coefficient. In other words, STF2 coefficients can be divided by the gain coefficient. Optionally, in task 1014, the mean value of NTF1 coefficients is removed from NTF1 coefficients. Various normalization schemes are envisioned by the disclosure, including normalizing coefficients to some other suitable value depending on the implementation.

In some implementations, the transfer functions are decimated to operate in a slow-rate domain. In task 1016, NTF1 coefficients are filtered or decimated with decimator transfer function, e.g., a decimate-by-4 transfer function. In task 1018, STF2 coefficients are filtered or decimated with decimator transfer function, e.g., a decimate-by-4 transfer function. The results of these two tasks are smaller sets of coefficients, e.g., going from 16-coefficients to a filter with 12 taps or 12 coefficients.

Optionally, a moving average to the past N number of estimations for the NTF/STF coefficients can be applied. The moving average of the last few N calculated sets of filter coefficients can reduce susceptibility to strong interfering signals. Optional averaging modes (e.g., averaging coefficients over different sizes of a moving window depending on the averaging mode) can reduce the impact of the strong input signal. Averaging modes, or different moving windows of various sizes, include: 0 (none), 2, 4, 8, and 16 sets of correlation results.

In task 1020, the coefficient sets are loaded into the programmable FIR filters, e.g., PFIRNTF and PFIRSTF filters (e.g., $DSTF_2$ 306 and $DNTF_1$ 308 of FIG. 3). If decimation is used, the coefficient sets can be loaded into the programmable FIR filters which processes decimated versions of the digital output signals from the stages of the multi-stage ADC (e.g., PFIRSTF 906 and PFIRNTF 916 of FIG. 9).

Method for tracking transfer functions in a CT MASH ADC

Figure 11:
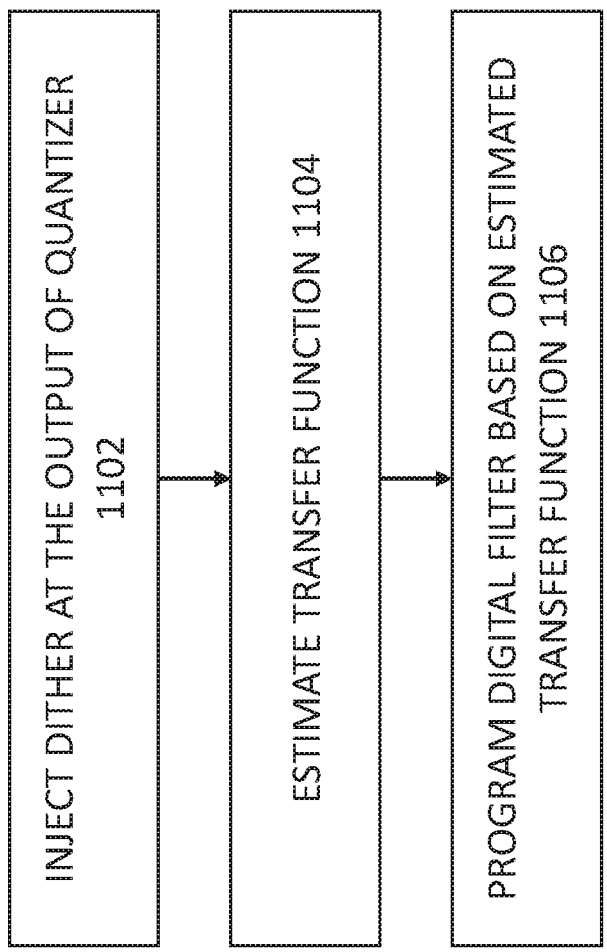
FIG. 11 is a flow diagram illustrating a method for tracking transfer functions in a CT MASH ADC, according to some embodiments of the disclosure.

FIG. 11 is a flow diagram illustrating a method for tracking transfer functions in a CT MASH ADC, or more broadly, multi-stage ADC, according to some embodiments of the disclosure. In task 1102, a dither signal is injected at the quantizer of the front end, e.g., at the output of the quantizer. The dither signal is a maximum length LFSR sequence, whose behavior approaches an impulse response. The quantizer can be the flash quantizer of a front-end of a continuous time multi-stage noise shaping ADC (as illustrated by FIGS. 2 and 5). In some cases, the quantizer can be the flash quantizer of a front end of a continuous time pipeline ADC.

In task 1104, the noise transfer function of the front end and the signal transfer function of the back end can be estimated by direct cross-correlation of the dither signal and a modulator output. Phrased differently, the front end and back end transfer functions for the continuous-time sigma-delta MASH ADCs are estimated directly through the cross-correlation between the injected maximum length LFSR sequence and the modulator outputs.

In task 1106, a digital filter can be programmed based on the estimated transfer function, e.g., for purposes of quantization noise cancellation. Coefficients of a programmable filter or digital filter for digital quantization noise cancellation (e.g., as illustrated by FIG. 3) may be updated based on the cross-correlation function.

In some embodiments, the method, e.g., for task 1104, may include determining a cross-correlation function of a digital output signal of the multi-stage ADC and the dither signal to determine a transfer function of the multi-stage ADC. For some embodiments, the digital output signal is an output signal of a front end of the multi-stage ADC (e.g., V1 of FIG. 3). The transfer function of interest is a noise transfer function of the front end (e.g., $NTF_1$). The programmable filter filters an output signal of a back end of the multi-stage ADC (e.g., $DNTF_1$ 308 for filtering V2). For some embodiments, the digital output signal is an output signal of a back end of the multi-stage ADC (e.g., V2 of FIG. 3). The transfer function of interest is a signal transfer function of the back end (e.g., $STF_2$). The programmable filter filters an output signal of a front end of the multi-stage ADC (e.g., $DSTF_2$ 306 for filtering V1).

In some embodiments, the averaging mode during transfer function estimation enhances the estimation accuracy by reducing the strong input interference to the transfer function learning. The method may further include applying a moving average on a plurality of coefficient sets computed based on the cross-correlation function. The size of the moving window of coefficient sets can be programmable.

In some embodiments, the method may include normalizing the cross-correlation function based on a gain coefficient computed from an estimated signal transfer function of the multi-stage ADC, or some other suitable value selected for the particular implementation.

In some embodiments, the cross-correlation with 2-level dither performed at full rate simplifies the implementation to addition/subtraction.

In some embodiments, the correlators can be time shared to enable the estimation of the longer impulse response and to reduce the area utilization.

In some embodiments, operating the estimated PFIRs at decimated rate reduces power dissipation. The PFIRs which model the front end NTF and back end STF in the data path are implemented in the lower rate with fewer taps by decimating the full rate PFIR coefficients through the decimator transfer function. The method may further include decimating the cross-correlation function to determine decimated coefficients (e.g., as illustrated by FIG. 8). Updating the coefficients of the programmable filter comprises updating the coefficients based on the decimated coefficients (e.g., as illustrated by FIG. 8). To use decimated PFIR filters to reduce power dissipation, the method may include decimating an output signal of the multi-stage ADC by one or more decimation filters to generate a decimated output signal and filtering the decimated output signal by the programmable filter (e.g., as seen in FIG. 9).

The cross-correlation-based forward model estimation identifies the frontend NTF and backend STF, as well as inter-stage timing and gain errors and tracks the transfer function change due to process, voltage, and temperature variation. The method advantageously tracks transfer function variation due to Integrator gain errors from R, C, and finite UGBW (unity-gain-bandwidth), Flash to DAC timing error, and inter-stage delay and gain variation. As a result, digital quantization noise cancellation which relies on the transfer function estimation can perform better. The method can be applied to extract the transfer function for the other types of continuous-time ADCs, such as CT pipeline.

Examples

Example 1 is a method for tracking a transfer function for digital quantization noise cancellation in a multi-stage analog-to-digital converter (ADC). The method comprises: injecting a dither signal at a quantizer of a front end of the multi-stage ADC, wherein the dither signal is a maximum length linear feedback shift registers sequence; determining a cross-correlation function of a digital output signal of the multi-stage ADC and the dither signal to determine a transfer function of the multi-stage ADC; and updating coefficients of a programmable filter for digital quantization noise cancellation based on the cross-correlation function.

In Example 2, Example 1 can further include the digital output signal being an output signal of a front end of the multi-stage ADC; the transfer function being a noise transfer function of the front end; and the programmable filter filtering an output signal of a back end of the multi-stage ADC.

In Example 3, any one of the above Examples can further include the digital output signal being an output signal of a back end of the multi-stage ADC; the transfer function being a signal transfer function of the back end; and the programmable filter filtering an output signal of a front end of the multi-stage ADC.

In Example 4, any one of the above Examples can further include decimating the cross-correlation function to determine decimated coefficients, wherein updating the coefficients of the programmable filter comprises updating the coefficients based on the decimated coefficients.

In Example 5, any one of the above Examples can further include decimating an output signal of the multi-stage ADC by one or more decimation filters to generate a decimated output signal; and filtering the decimated output signal by the programmable filter.

In Example 6, any one of the above Examples can further include normalizing the cross-correlation function based on a gain coefficient computed from an estimated signal transfer function of the multi-stage ADC.

In Example 7, any one of the above Examples can further include applying a moving average on a plurality of coefficient sets computed based on the cross-correlation function.

Example 8 is a system for tracking a transfer function for digital quantization noise cancellation in a multi-stage analog-to-digital converter (ADC). The system comprises: a dither block for generating a maximum-length linear feedback shift registers (LFSR) sequence, said dither block coupled to a quantizer of a front end of the multi-stage ADC; a cross-correlation hardware block receiving a digital output of the multi-stage ADC and the maximum-length LFSR sequence and generating coefficients of a cross-correlation function; and a digital quantization noise cancellation filter programmable based on the coefficients of the cross-correlation function.

In Example 9, any one of the above examples can further include the cross-correlation hardware block comprising: a multiplexer for (1) selecting a value among a plurality of values of the maximum-length sequence and providing the selected value to a correlator during a first time period, and (2) selecting another value among a plurality of values of the maximum-length sequence and providing the selected value to the correlator during a second time period.

In Example 10, any one of the above examples can further include the cross-correlation hardware block comprising: a multiplexer for (1) selecting an output of a first stage of the multi-stage ADC and providing the selected output of the first stage to a plurality of correlators during a first time period, and (2) selecting an output of a second stage of the multi-stage ADC and providing the selected output of the second stage to the plurality of correlators during a second time period.

In Example 11, any one of the above examples can further include the maximum-length LFSR sequence being a 2-level dither sequence.

In Example 12, any one of the above examples can further include the cross-correlation hardware block comprising: an accumulator for receiving a value of the maximum-length LFSR sequence and the digital output of the multi-stage ADC, wherein a level of the value of the maximum-length LFSR sequence determines whether the digital output is subtracted or added to an accumulated value of the accumulator.

In Example 13, any one of the above examples can further include a moving average filter for filtering coefficients of the cross-correlation function.

In Example 14, any one of the above examples can further include the moving average filter having a programmable moving window size.

In Example 15, any one of the above examples can further include one or more decimation filters for filtering the cross-correlation function.

In Example 16, any one of the above examples can further include one or more decimation filters for filtering the digital output of the multi-stage ADC and generating a decimated digital output, wherein the digital quantization noise cancellation filter filters the decimated digital output.

In Example 17, any one of the above examples can further include a normalization block for normalizing the coefficients of the cross-correlation function to a gain coefficient.

In Example 18, any one of the above examples can further include a microprocessor on-chip with the multi-stage ADC for controlling the cross-correlation hardware block, reading the coefficients of the cross-correlation function from the cross-correlation hardware block, and programming the digital quantization noise cancellation filter.

In Example 19, any one of the above examples can further include the multi-stage ADC being a continuous time multi-stage noise shaping ADC.

Example 20 is an apparatus comprising: a plurality of continuous-time analog-to-digital converters (ADCs) in cascade; means for generating a sequence which approaches an impulse response and injecting the sequence to a quantizer of a first ADC of the plurality of ADCs; means for computing coefficients of a cross-correlation function between the sequence and a given digital output of one of the ADCs of the plurality of ADC; and means for digital quantization noise cancellation which is programmable based on the coefficients of the cross-correlation function.

In Example 21, Example 20 can further include means for implementing or carrying out any one or combination of features in Examples 1-7.

Other Implementation Notes, Variations, and Applications

In some embodiments, an apparatus comprises a plurality of continuous-time analog-to-digital converters (ADCs) in cascade. The ADCs can form a CT MASH ADC, a CT pipeline ADC, etc. The apparatus further includes means for generating a sequence which approaches an impulse response and injecting the sequence to a quantizer of a first ADC of the plurality of ADCs. The means may include the PN block 502 of FIG. 5. The sequence can be the maximum-length LFSR sequence. The sequence can be a 2-level sequence. The sequence may be injected at the input of the quantizer. The sequence may be injected at the output of the quantizer. The apparatus may further include means for computing coefficients of a cross-correlation function between the sequence and a given digital output of one of the ADCs of the plurality of ADC. The means corresponds to various circuitry associated with the cross-correlation hardware block described herein (e.g., in FIGS. 5-7 and their accompanying description). The apparatus can include means for digital quantization noise cancellation which is programmable based on the coefficients of the cross-correlation function. The means can include programmable FIR filters, such as ones seen in FIGS. 3 and 9.

In some embodiments, a system or integrated circuit for tracking a transfer function for digital quantization noise cancellation in a multi-stage analog-to-digital converter (ADC) comprises a dither block, a cross-correlation hardware block, and one or more digital quantization noise cancellation filter. The dither block (e.g., dither block 502 of FIG. 5) can include circuitry to generate a maximum-length linear feedback shift registers (LFSR) sequence. The dither block is preferably coupled to an output of a quantizer of a front end of the multi-stage ADC (e.g., as seen in FIG. 5). The cross-correlation hardware block receives a digital output of the multi-stage ADC and the maximum-length LFSR sequence and generates coefficients of a cross-correlation function (e.g., as illustrated by FIGS. 5-7 and their accompanying description). The digital quantization noise cancellation filter (e.g., $DSTF_2$ 306 for filtering V1 and $DNTF_1$ 308 for filtering V2) is programmable based on the coefficients of cross-correlation function.

To reduce hardware, the cross-correlation hardware block can include a multiplexer for selecting a value among a plurality of values of the maximum-length sequence and providing the selected value to a correlator during a first time period and selecting another value among a plurality of values of the maximum-length sequence and providing the selected value to the correlator during a second time period. The multiplexer is illustrated by the scheme illustrated in FIG. 7. In some embodiments, the cross-correlation hardware block can be shared between a plurality of stages of the multi-stage ADC. The cross-correlation hardware block can include a multiplexer for selecting an output of a first stage of the multi-stage ADC and providing the selected output of the first stage to a plurality of correlators during a first time period and selecting an output of a second stage of the multi-stage ADC and providing the selected output of the second stage to the plurality of correlators during a second time period. Referring back to FIG. 5, one XCORR block can be used instead of having both XCORR blocks 530 and 540.

By using 2-level sequence as the dither signal or maximum-length LFSR sequence can greatly simplify the implementation cross-correlation hardware block. In some embodiments, the cross-correlation hardware block comprises an accumulator for receiving a value of the maximum-length LFSR sequence and the digital output of the multi-stage ADC, wherein a level of the value of the maximum-length LFSR sequence determines whether the digital output is subtracted or added to an accumulated value of the accumulator. An example of the accumulator is illustrated by FIGS. 6 and 7 and their accompanying description.

In some embodiments, the system or integrated circuit can include a moving average filter for filtering coefficients of the cross-correlation function. The moving average filter can have a programmable moving window size, which can be programmed by an on-chip microprocessor (based on one or more conditions of the multi-stage ADC, such as a condition on the input or output signals of the multi-stage ADC).

To reduce power dissipation of the digital quantization noise filters, decimation can be implemented. The system or integrated circuit may include one or more decimation filters for filtering the cross-correlation function, and one or more decimation filters for filtering the digital output of the multi-stage ADC and generating a decimated digital output. The digital quantization noise cancellation filter filters the decimated digital output. The scheme is illustrated by FIGS. 8 and 9.

In some embodiments, the system or integrated circuit can include a normalization block for normalizing the coefficients of cross-correlation function to a gain coefficient, or some other desired value depending on the implementation.

In some embodiments, the system or integrated circuit includes a microprocessor on-chip with the multi-stage ADC for controlling the cross-correlation hardware block, reading the coefficients of cross-correlation function from cross-correlation hardware block, and programming the digital quantization noise cancellation filter. While cross-correlation is typically performed by dedicated digital circuitry, operations relating to normalization, decimation, averaging (or other processing of the coefficients computed by the cross-correlation hardware block) can be carried out by the on-chip microprocessor.

While the embodiments described herein are described in relation to adaptive quantization noise cancellation filters in a CT MASH ADC, the techniques can be applied to other multi-stage ADCs architectures, such as a CT pipeline ADC. Furthermore, the techniques can be used for estimating the transfer function in any one of the stages of a MASH ADC. The techniques are applicable to various MASH ADCs, including continuous-time MASH ADCs (which uses continuous-time circuits), discrete-time MASH ADCs (which uses switched-capacitor circuits), or a hybrid continuous-time and discrete-time MASH ADC.

While some examples herein relate to a 1-2 MASH ADC, the adaptive quantization noise cancellation filters are applicable to MASH ADCs having different order modulators (e.g., a 2-2 MASH ADCs), or MASH ADCs having more than two stages.

The present architecture for adaptive quantization noise cancellation filters are particularly suitable for high speed, continuous-time, high precision applications where MASH ADCs are used. Applications which can greatly benefit from the architecture include: instrumentation, testing, spectral analyzers, military purposes, radar, wired or wireless communications, mobile telephones (especially because standards continue to push for higher speed communications), and base stations.

The width of radio frequency (RF) bands commonly used for cellular telecommunications has grown from 35-75 MHz for 2G/3G/4G platforms to 100-200 MHz for today's Long Term Evolution (LTE) and the desire for relaxed image rejection filtering has pushed the direct intermediate frequency (IF) sampling frequencies to 300+MHz. In some embodiments, the adaptive digital quantization noise cancellation features can be used in a continuous-time (CT) multi-stage noise-shaping (MASH) ADC integrated circuit which achieves 69 dB of DR over a 465 MHz signal bandwidth with a combined power consumption of 930 mW from ±1.0V/1.8V supplies. The ADC integrated circuit can be implemented in 28 nm CMOS and achieves a peak SNDR of 64 dB, a small-signal noise-spectral density (NSD) of −156 dBFS/Hz, and a figure-of-merit (FOM) of 156 dB over a signal bandwidth of 465 MHz. With an 8 GHz sample rate and a signal bandwidth of 465 MHz, the oversampling ratio (OSR) is 8.6. A 1-2 MASH architecture can be chosen to achieve aggressive noise-shaping at a low OSR. The use of low-order sub-loops also contributes to the robustness of the overall ADC. The first stage can be a first-order modulator to minimize the power of amplifiers for a given thermal noise requirement under a low OSR scenario. The first stage can include an active-RC integrator, a 17-level flash ADC (FLASH1), a current-steering DAC (IDAC1), and a capacitive-DAC (CDAC1). CDAC1 implements a fast direct-feedback (DFB) loop to compensate for the excess loop delay associated with the chosen FLASH-IDAC timing. A differential 200Ω R1U and a 625 uA IDAC1 LSB can set a 2V differential p-p input full-scale. A dither block adds a 1-bit ½-LSB dither signal to the output of FLASH1. The quantization residue of the first-stage is injected into the second-stage via R21 and current-steering DAC (IDAC2A). R21 is implemented as an all-pass RC lattice filter to provide both accurate transconductance and a group delay that approximately matches the delay through the FLASH1-IDAC2A path. The residue current is then digitized by the second-order second stage. The second stage consists of an active-RC resonator, a 17-level flash ADC (FLASH2), current steering DACs (IDAC2B and IDAC3), and a capacitive-DAC (CDAC2) used to provide a DFB loop. The second stage uses a feedback topology to minimize STF peaking and the input full-scale of the second stage is scaled down to provide an inter-stage gain of six to minimize the overall quantization noise floor while preventing the residue of the first stage from saturating the second stage. The digital outputs of both stages, V1 and V2, are fed to the digital backend for further processing. A 10-tap programmable FIR filter (DNCF) can implement digital quantization noise cancellation and equalization after decimation (DEC) by a factor of four. DNCF coefficients can be generated using an off-chip LMS algorithm during an integrated start-up calibration phase.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to adaptive quantization noise cancellation filters, such as the processes shown in FIGS. 10 and 11, illustrate only some of the possible functions that may be executed by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A method for tracking a transfer function for digital quantization noise cancellation in a multi-stage analog-to-digital converter (ADC), the method comprising:
    injecting a dither signal at a quantizer of a front end of the multi-stage ADC, wherein the dither signal is a maximum length linear feedback shift registers sequence;
    determining a cross-correlation function of a digital output signal of the multi-stage ADC and the dither signal to determine a transfer function of the multi-stage ADC; and
    updating coefficients of a programmable filter for digital quantization noise cancellation based on the cross-correlation function.

2. The method of claim 1, wherein:
    the digital output signal is an output signal of the front end of the multi-stage ADC;
    the transfer function is a noise transfer function of the front end; and
    the programmable filter filters an output signal of a back end of the multi-stage ADC.

3. The method of claim 1, wherein:
    the digital output signal is an output signal of a back end of the multi-stage ADC;
    the transfer function is a signal transfer function of the back end; and
    the programmable filter filters an output signal of the front end of the multi-stage ADC.

4. The method of claim 1, further comprising:
    decimating the cross-correlation function to determine decimated coefficients;
    wherein updating the coefficients of the programmable filter comprises updating the coefficients based on the decimated coefficients.

5. The method of claim 1, further comprising:
    decimating an output signal of the multi-stage ADC by one or more decimation filters to generate a decimated output signal; and
    filtering the decimated output signal by the programmable filter.

6. The method of claim 1, further comprising:
normalizing the cross-correlation function based on a gain coefficient computed from an estimated signal transfer function of the multi-stage ADC.

7. The method of claim 1, further comprising:
applying a moving average on a plurality of coefficient sets computed based on the cross-correlation function.

8. A system for tracking a transfer function for digital quantization noise cancellation in a multi-stage analog-to-digital converter (ADC), the system comprising:
a dither block for generating a maximum-length linear feedback shift registers (LFSR) sequence, said dither block coupled to a quantizer of a front end of the multi-stage ADC;
a cross-correlation hardware block receiving a digital output of the multi-stage ADC and the maximum-length LFSR sequence and generating coefficients of a cross-correlation function; and
a digital quantization noise cancellation filter programmable based on the coefficients of the cross-correlation function.

9. The system of claim 8, wherein the cross-correlation hardware block comprises:
a multiplexer for (1) selecting a value among a plurality of values of the maximum-length sequence and providing the selected value to a correlator during a first time period and (2) selecting another value among a plurality of values of the maximum-length sequence and providing the selected value to the correlator during a second time period.

10. The system of claim 8, wherein the cross-correlation hardware block comprises:
a multiplexer for (1) selecting an output of a first stage of the multi-stage ADC and providing the selected output of the first stage to a plurality of correlators during a first time period, and (2) selecting an output of a second stage of the multi-stage ADC and providing the selected output of the second stage to the plurality of correlators during a second time period.

11. The system of claim 8, wherein the maximum-length LFSR sequence is a 2-level dither sequence.

12. The system of claim 8, wherein the cross-correlation hardware block comprises:
an accumulator for receiving a value of the maximum-length LFSR sequence and the digital output of the multi-stage ADC, wherein a level of the value of the maximum-length LFSR sequence determines whether the digital output is subtracted or added to an accumulated value of the accumulator.

13. The system of claim 8, further comprising:
a moving average filter for filtering coefficients of the cross-correlation function.

14. The system of claim 13, wherein the moving average filter has a programmable moving window size.

15. The system of claim 8, further comprising:
one or more decimation filters for filtering the cross-correlation function.

16. The system of claim 8, further comprising:
one or more decimation filters for filtering the digital output of the multi-stage ADC and generating a decimated digital output;
wherein the digital quantization noise cancellation filter filters the decimated digital output.

17. The system of claim 8, further comprising:
a normalization block for normalizing the coefficients of the cross-correlation function to a gain coefficient.

18. The system of claim 8, further comprising:
a microprocessor on-chip with the multi-stage ADC for controlling the cross-correlation hardware block, reading the coefficients of the cross-correlation function from the cross-correlation hardware block, and programming the digital quantization noise cancellation filter.

19. The system of claim 8, wherein the multi-stage ADC is a continuous time multi-stage noise shaping ADC.

20. An apparatus comprising:
a plurality of continuous-time analog-to-digital converters (ADCs) in cascade;
means for generating a sequence which approaches an impulse response and injecting the sequence to a quantizer of a first ADC of the plurality of ADCs;
means for computing coefficients of a cross-correlation function between the sequence and a given digital output of one of the plurality of ADCs; and
means for digital quantization noise cancellation which is programmable based on the coefficients of the cross-correlation function.

* * * * *